United States Patent [19]

Ralph

[11] Patent Number: 5,745,017

[45] Date of Patent: *Apr. 28, 1998

[54] THICK FILM CONSTRUCT FOR QUADRATURE TRANSLATION OF RF SIGNALS

[75] Inventor: Loren E. Ralph, Citrus Heights, Calif.

[73] Assignee: RF Prime Corporation, Sacramento, Calif.

[*] Notice: The term of this patent shall not extend beyond the expiration date of Pat. No. 5,534,830.

[21] Appl. No.: 718,084

[22] Filed: Sep. 17, 1996

Related U.S. Application Data

[63] Continuation-in-part of Ser. No. 645,512, May 14, 1996, Pat. No. 5,640,132, and Ser. No. 645,530, May 14, 1996, Pat. No. 5,640,134, and Ser. No. 645,602, May 14, 1996, Pat. No. 5,640,699, which is a division of Ser. No. 368,551, Jan. 3, 1995, Pat. No. 5,534,830.

[51] Int. Cl.$^6$ .............. H01P 5/18; H03D 9/00; H03C 1/00; H04B 1/26

[52] U.S. Cl. .............. 333/116; 329/354; 332/163; 333/238; 455/327

[58] Field of Search .............. 333/4, 5, 26, 109, 333/116, 238, 246; 329/354; 332/163, 164; 455/325–327

[56] References Cited

U.S. PATENT DOCUMENTS

| | | | |
|---|---|---|---|
| 3,260,972 | 7/1966 | Pusch | 333/238 |
| 3,381,244 | 4/1968 | Dalley | 333/116 |
| 3,621,486 | 11/1971 | Gunshinan et al. | 333/246 |
| 4,063,176 | 12/1977 | Milligan et al. | 333/26 X |
| 4,260,963 | 4/1981 | Drapac | 333/238 X |
| 4,382,236 | 5/1983 | Suzuki | 333/1 |
| 4,724,182 | 2/1988 | Kato et al. | 428/210 |
| 4,755,775 | 7/1988 | Marczewski et al. | 333/26 |
| 4,774,127 | 9/1988 | Reagan et al. | 428/209 |
| 4,785,202 | 11/1988 | Toyoda | 333/246 X |
| 4,835,038 | 5/1989 | Kaneko et al. | 428/209 |
| 4,847,003 | 7/1989 | Palanisamy | 252/514 |
| 4,891,259 | 1/1990 | Moran | 428/209 |
| 4,939,022 | 7/1990 | Palanisamy | 428/209 |
| 5,025,232 | 6/1991 | Pavio | 333/26 |
| 5,061,910 | 10/1991 | Bouny | 333/26 |
| 5,135,595 | 8/1992 | Acocella et al. | 156/89 |
| 5,139,851 | 8/1992 | Acocella et al. | 428/209 |
| 5,304,959 | 4/1994 | Wisherd et al. | 333/26 |
| 5,389,735 | 2/1995 | Bockelman | 333/4 X |
| 5,428,840 | 6/1995 | Sadhir | 333/26 X |
| 5,534,830 | 7/1996 | Ralph | 333/5 X |
| 5,576,669 | 11/1996 | Ruelke | 333/116 |
| 5,594,393 | 1/1997 | Bischof | 333/26 |

FOREIGN PATENT DOCUMENTS 148405  8/1984  Japan.

OTHER PUBLICATIONS

Itoh, *Overview of Quasi-Planer Transmission Lines*, IEEE Trans. on MTT, vol. 37, No. 2, Feb. 1989, pp. 275–280.

Barber, Richard G., *Enhanced Coupled, Even Mode Terminated Baluns and Mixers Constructed Therefrom*, IEEE MTT-S Digest, 1990, pp. 495–498 No Month.

*Primary Examiner*—Paul Gensler
*Attorney, Agent, or Firm*—John P. O'Banion

[57] ABSTRACT

A thick film construct and quadrature coupler for use in fabricating devices such as IQ modulators, IQ demodulators, vector modulators, image reject mixers, and multi-channel mixers. The thick film construct includes a dielectric substrate base with a metallized backside, a first metal trace deposited on the non-metallized side of the substrate base, a dielectric layer deposited over and around the first metal trace, and a second metal trace deposited on the dielectric layer. The first and second metal traces are aligned over their widths and lengths so to form a balanced transmission line structure where the first and second metal traces represent top and bottom lines in the balanced structure. This thick film structure serves as the foundation for microwave capacitors, mixers, and other transmission line based structures, including a quadrature coupler. The quadrature coupler which, in turn forms the basis for more complex devices, includes an input port, an isolated port, in-phase output port (I-port), and quadrature phase output port (Q-port).

21 Claims, 8 Drawing Sheets

FIG. — 4

THICK FILM CONSTRUCT FOR QUADRATURE TRANSLATION OF RF SIGNALS

CROSS-REFERENCE TO RELATED APPLICATIONS

This application is a continuation-in-part of applications Ser. No. 08/645,512, now U.S. Pat. No. 5,640,132 and Ser. No. 08/645,530, now U.S. Pat. No. 5,640,134 and Ser. No. 08/645,602, now U.S. Pat. No. 5,640,699, all of which were filed on May 14, 1996 as divisionals of application Ser. No. 08/368,551 filed on Jan. 3, 1995. Application Ser. No. 08/368,551 filed on Jan. 3, 1995 is now U.S. Pat. No. 5,534,830 which is incorporated by reference herein.

BACKGROUND OF THE INVENTION

1. Field of the Invention

This invention pertains generally to passive microwave structures using a thick film construction, and more particularly to a thick film construct and quadrature coupler for the fabrication of devices such as IQ modulators, IQ demodulators, vector modulators, image reject mixers, and multi-channel mixers.

2. Description of the Background Art

Devices providing for quadrature modulation or vector modulation are typically constructed using a combination of two matched frequency translation devices ("mixers"), a coupler device ("quadrature coupler") consisting of one input port and two output ports exhibiting an output level equal to one-half the input port power with a phase differential between the two output ports of ninety degrees, and a zero phase difference power divider/summer. These devices can be fabricated using many different constructs. For example, lower frequency devices (<2 Ghz) are usually assembled using a combination of ferrite cores and bifilar wire to create the quadrature hybrid, mixer baluns, and power splitters. However, such devices are typically hand wound due to their size and complexity, and cannot be assembled in a automated fashion. On the other hand, higher frequency devices are typically assembled using some type of soft board material, such as PTFE soft board. However, structures built using this technology tend to be large in size, and often require a certain level of hand assembly to make work.

Because quadrature devices are used in the construction of microwave IQ modulators, IQ demodulators, vector modulators, image reject mixers, and multi-channel mixers, there is need for a construct for such devices which is low in cost, repeatable to manufacture, and compatible with commonly used surface mount assembly techniques. The present invention satisfies that need, as well as others, and overcomes the deficiencies found in the previously developed devices.

SUMMARY OF THE INVENTION

The present invention pertains generally to quadrature coupler devices and more particularly to a thick film construct and quadrature coupler for use in fabricating devices such as IQ modulators, IQ demodulators, vector modulators, image reject mixers, and multi-channel mixers.

By way of example, and not of limitation, a thick film construct in accordance with the present invention comprises a dielectric substrate base with a metallized backside, a first metal trace deposited on the non-metallized side of the substrate base, a dielectric layer deposited over and around the first metal trace, and a second metal trace deposited on the dielectric layer. The first and second metal traces are aligned over their widths and lengths so to form a balanced transmission line structure where the first and second metal traces represent top and bottom lines in the balanced structure. This thick film structure serves as the foundation for microwave capacitors, mixers, and other transmission line based structures, including a quadrature coupler. The quadrature coupler in turn forms the basis for more complex devices such as mixers, modulators, demodulators and the like.

In the thick film balanced line structure described in prior U.S. Pat. No. 5,534,830, owned by the assignee hereof, the substrate base did not have a metallized backside, the thickness of the dielectric was 0.0026 inches nominal, and the dielectric constant was in the range of approximately 6 to 10. In the construct of the present invention, however, a backside groundplane has been added to the substrate base. Further, in order to achieve the same line impedances as before, the dielectric constant of the present invention has been lowered to a range of approximately 2 to 6 since the line widths of the prior structure were already near the minimum fabrication tolerances for thick film construction.

By way of further example, and not of limitation, a quadrature coupler in accordance with the present invention comprises a four port device, with an input port, an isolated port, in-phase output port (I-port), and quadrature phase output port (Q-port). The device is symmetrical about a center line, with dielectric "vias" interconnecting opposite top and bottom lines where dictated by the circuit. This crossover functions to equalize the phase velocity of the top and bottom lines, creating a flatter response versus frequency for the quadrature phase characteristics. Coupled elements connected to the center of the structure create capacitor elements to ground for both top lines. This configuration creates a phase adjustment that centers the performance of the quadrature coupler and provides compensation to variations in fabrication, since the capacitors are manufactured using the same dielectric material and contribute a coupling adjustment that is inverse to that of the main coupled structure with variations in dielectric thickness.

Because quadrature coupler performance is the most critical element of a quadrature based device, fabrication of the quadrature coupler dictates the fabrication for the entire device. Optimum performance is achieved by, but not limited to, using a base substrate of alumina 96 material. To simplify construction, all devices employing the quadrature coupler of the present invention are constructed using the same thickness as the quadrature coupler.

A mixer in accordance with the present invention follows the topology of the mixer described in U.S. Pat. No. 5,534,830, with the addition of a diplexer element at the I-port connection, and the optional inclusion of a low pass filter at the intermediate frequency (IF) input port.

A modulator in accordance with the present invention comprises the quadrature coupler and two mixers, with the outputs of the two mixers feeding an in-phase (zero phase difference) power combiner. The in-phase power combiner is constructed by one of two means. For minimal insertion loss but reduced bandwidth, the two-way power splitter/combiner described in U.S. Pat. No. 5,534,830 can be incorporated, modified to work with the new fabrication layers. A simpler structure can be implemented using a combiner/splitter comprising thick film resistors. A demodulator would follow the same circuit with the inputs and outputs simply reversed.

Due to the complexity of the circuitry, along with the requirements for tight phase and amplitude balance, part of the design implementation incorporates a high degree of symmetry within the structure. This improves the balance of the ground currents in the device, improving the overall performance.

An object of the invention is to provide for a class of quadrature devices using thick film multi-layer technology.

Another object of the invention is to provide for automated device assembly.

Another object of the invention is to provide for surface mount attachment of quadrature devices.

Another object of the invention is to provide for repeatable and predictable device performance.

In addition, said assemblies are constructed in a manner such that the manufacturing of said designs can be done using automated assembly equipment, and the final construction can be attached using automated surface mount attachment equipment.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DESCRIPTION OF THE PREFERRED EMBODIMENTS

Figure 1:
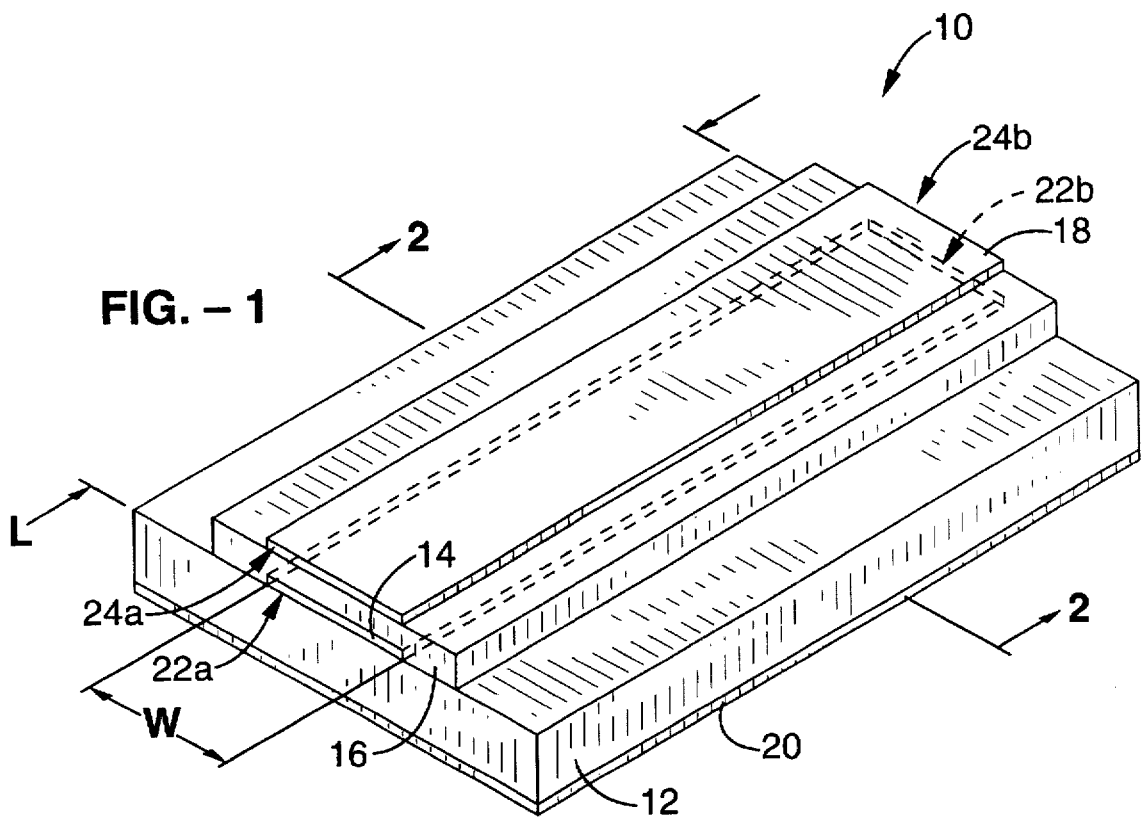
FIG. 1 is a diagrammatic perspective view of a balanced transmission line cell in accordance with the present invention.
Figure 2:
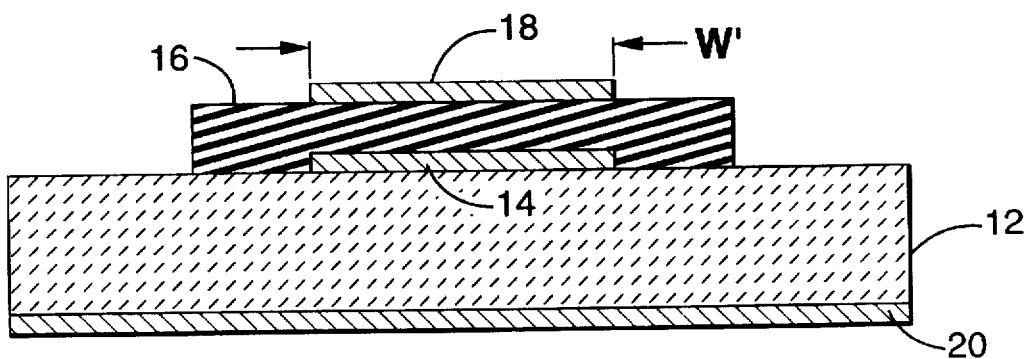
FIG. 2 is a cross-sectional view of the apparatus shown in FIG. 1 taken through line 2—2.

Referring more specifically to the drawings, where like reference numerals denote like parts, for illustrative purposes the present invention is embodied in the apparatus generally shown in FIG. 1 and FIG. 2, as well as various microwave devices fabricated therefrom, examples of which are shown in FIG. 3 through FIG. 9. It will be appreciated that the apparatus may vary as to configuration and as to details of the parts without departing from the basic concepts as disclosed herein.

Referring to FIG. 1 and FIG. 2, a balanced transmission line cell 10 in accordance with the present invention is formed on a substrate base 12 which serves as a support structure. Substrate base 12 is typically fabricated from a high alumina content ceramic material, such as 96% alumina or the like. The thickness of substrate base 12 is preferably approximately 0.025 inches but could be as thick as approximately 0.030 inches in thickness, depending on the lead frame used and overall package height.

Using standard thick film print and fire assembly techniques, a gold paste approximately 8 microns to approximately 12 microns thick and having a width W is deposited on top of substrate base 12 to form a first continuous metal trace 14. Gold is preferred since it is a low loss material at microwave frequencies, has fine deposition resolution, and is compatible with wire bond operations. Width W is typically in the range of approximately 0.006 inches to approximately 0.010 inches. However, when cell 10 is implemented as a capacitor, the width of first metal trace 14 can be a wide as 0.020 inches depending upon the capacitance desired.

A dielectric layer 16 is deposited over and around first metal trace 14 by multiple print and fires of the dielectric material until a uniform layer with a consistent thickness is created. Preferably, dielectric layer 16 will have a dielectric constant of 4.5 for optimal performance, but can range from approximately two to six. Further, the thickness of dielectric layer 16 should be in the range of approximately 0.001 inches to approximately 0.002 inches and, preferably, the thickness is nominally 0.0016 inches for optimum coupler performance. This thickness provides an odd mode line impedance of approximately 20 ohms with line widths of approximately 0.006 inches as required by a nominal 50 ohm quadrature coupler.

A second continuous metal trace 18 of gold is deposited on top of dielectric layer 16 in the same manner as first metal trace 14, and having the same nominal thickness as first metal trace 14. While the width W' of second metal trace 18 can be the same as first metal trace 14, the bandwidth of the cell can be optimized by making the width of second metal trace 18 less than that of first metal trace 14. The typical range for W' would be approximately 0.005 inches to 0.008 inches where W ranges from approximately 0.006 inches to 0.010 inches. The slight difference in line widths will optimize bandwidth by equalizing the differences between the dielectric constant of air around the exposed surface of second metal trace 18 and the dielectric constant of dielectric layer 16 and substrate base 12 that surround first metal trace 14.

Second metal trace 18 is positioned such that it is generally aligned with and generally parallel to first metal trace 14 over the length and widths of the traces, and such that the ends of the traces are aligned. This maintains a balanced transmission line structure. It will be appreciated, however, that in fabrication of devices employing the transmission line cell of the invention, the metal traces may be extended for purposes of electrical connections or device packaging. In such cases, the physical ends of the traces will extend beyond what is considered to be the balanced transmission line, but the ends of the traces will still be aligned for purposes of the balanced transmission line.

A metal backplane layer 20 having a thickness of approximately 0.0006 inches to approximately 0.0012 inches covers the entire bottom area of substrate base 12 to form a ground plane element for the purpose of controlling the even mode impedance of first and second metal traces, 14, 18. The shunt capacitance created by this element sets the even mode impedance to approximately 120 ohms, which is the impedance required for a 3 dB quadrature coupler. Furthermore, the phase velocity in the even mode is approximately equal to the odd mode, thus improving bandwidth.

The length L of the transmission line formed by first and second metal traces 14, 18 determines the frequency of operation, and is preferably selected to be approximately one-eighth of the desired wavelength for coupler operation, and approximately one-quarter of the desired wavelength for optimum mixer performance. The transmission line has an odd mode impedance which is determined by the widths of first and second metal traces 14, 18 and the thickness of dielectric 16, and has an even mode impedance that is established by metal backplane layer 20 and is a function of the widths of first and second metal traces 14, 18.

Cell 10 includes two ports 22a, 22b on first metal trace 14 and two ports 24a, 24b on second metal trace 18, that can be connected in various configurations. For example, referring to FIG. 3, a quadrature coupler 26 employing four transmission line cells 10 in accordance with the present invention is shown. Cells 28, 30, 46 and 48 represent the four cells of such a device.

The first set of cells 28, 30 establish the four port device, with an input port 36, an isolated port 38, and in-phase output port (I-port) 40 and a quadrature phase output port (Q-port) 42. Isolated port 38 is terminated to ground using a 50 ohm resistor 44 to match the 50 ohm device impedance. The lower and upper traces 14, 18 of these cells typically have widths of approximately 0.006 inches to 0.008 inches, giving the desired odd and even mode impedances of approximately 20 ohms and 120 ohms respectfully.

The second set of cells 46, 48 act as capacitors to ground to provide for bandwidth selection and phase response of the quadrature coupler; that is, to open and close the "Eye-function" which changes the overall bandwidth of the coupler. The capacitance values are chosen in a conventional manner for amplitude balance vs. bandwidth. The upper traces 18 of these capacitors typically have the same widths as the upper traces 18 of cells 28, 30 (e.g., 0.006 inches to 0.008 inches) while the lower traces 14 typically have widths ranging from 0.008 inches to 0.020 inches depending upon the desired characteristics. Trace lengths are chosen in a conventional manner based on their widths and the desired capacitance value.

To form the quadrature coupler 26, the cells are connected in the following manner. Input port 36 is connected to one end of the bottom trace 50 of cell 28 and in-phase output port 40 is connected to the corresponding end of top trace 52 of that same cell. The opposite end of bottom trace 50 of cell 28 is connected to one end of the top trace 54 of cell 30 and the opposite end of top trace 52 of cell 28 is connected to the corresponding end of bottom trace 56 of cell 30. The opposite end of bottom trace 56 of cell 30 is connected to isolated port 38 and termination resistor 44 is connected from isolated port 38 to ground. The opposite end of top trace 54 is connected to quadrature phase output port 42.

One end of the top trace 58 of cell 46 is connected to the connection between top trace 52 of cell 28 and bottom trace 56 of cell 30. The opposite end of top trace 58 as well as both ends of bottom trace 60 of cell 46 are left unconnected. However, bottom trace 60 of cell 46 is connected to ground at its approximate midpoint. Similarly, one end of the top trace 62 of cell 48 is connected to the connection between bottom trace 50 of cell 28 and top trace 54 of cell 30. The opposite end of top trace 62 as well as both ends of bottom trace 64 of cell 48 are left unconnected. However, bottom trace 64 of cell 48 is connected to ground at its approximate midpoint. Cells 46, 48 thus form shunt capacitors.

Figure 4:
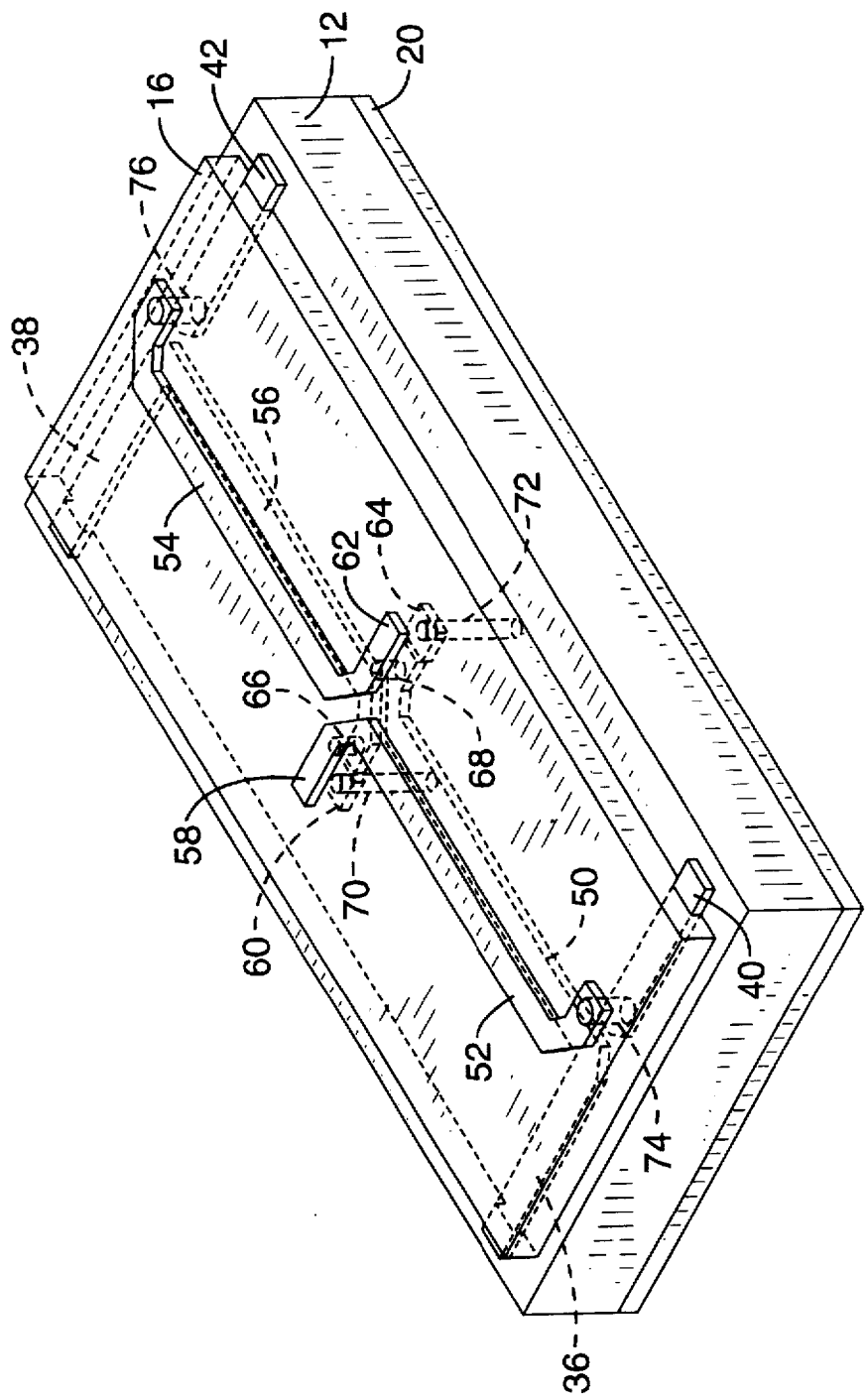
FIG. 4 is a diagrammatic perspective view of a quadrature coupler corresponding to the schematic diagram shown in FIG. 3.

Referring also to FIG. 4, a metallized "via" hole 66 through dielectric layer 16 provides the electrical connection between top trace 52 of cell 28 and bottom trace 56 of cell 30. Similarly, a metallized via hole 68 through dielectric layer 16 provides the electrical connection between bottom trace 50 of cell 38 and top trace 54 of cell 30. For ground connections, bottom trace 60 of cell 46 is electrically connected to backplane layer 20 with a metallized via hole 70 through substrate base 12 and bottom trace 64 of cell 48 is electrically connected to backplane layer 20 with a metallized via hole 72 through substrate base 12. Metallized via holes 74, 76 are used to connect top traces 52, 54 to in-phase output port 40 and quadrature phase output port 42, respectively.

Note also, that in the device shown, backplane layer 20, substrate base 12 and dielectric layer 16 are contiguous and common among all of the cells. This is the preferred method of fabrication rather than connecting four physically separate cells. It also permits top traces 58, 62 of cells 46, 48 to be printed as continuous extensions of top traces 52, 54 of cells 28, 30 so that separate electrical connections are not required.

Figure 5:
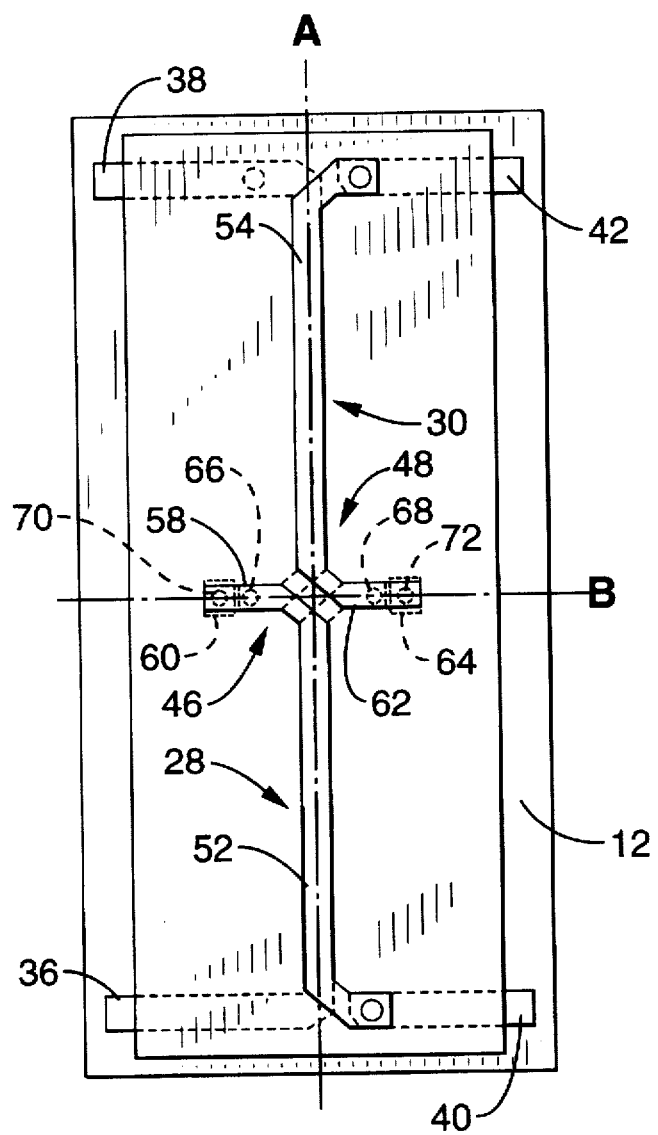
FIG. 5 is a top plan view of the quadrature coupler shown in FIG. 4.

Referring also to FIG. 5, quadrature coupler 26 exhibits a high degree of symmetry within the structure. The interconnected ends of cells 28, 30 are positioned opposite each other, wherein the cells each have a longitudinal axis extending between their ends and the longitudinal axes are aligned so as to form a common longitudinal axis A, wherein a lateral axis B passes between the ends of the interconnected traces such that lateral axis B is perpendicular to common longitudinal axis A and passes through the centers of via holes 70, 72. Cells 28, 20 are thusly symmetrical about lateral axis B. Note also that Cells 46, 48 are symmetrical about axis A. This symmetry improves the balance of the ground currents in the device, thereby improving the overall performance of the device.

Figure 6:
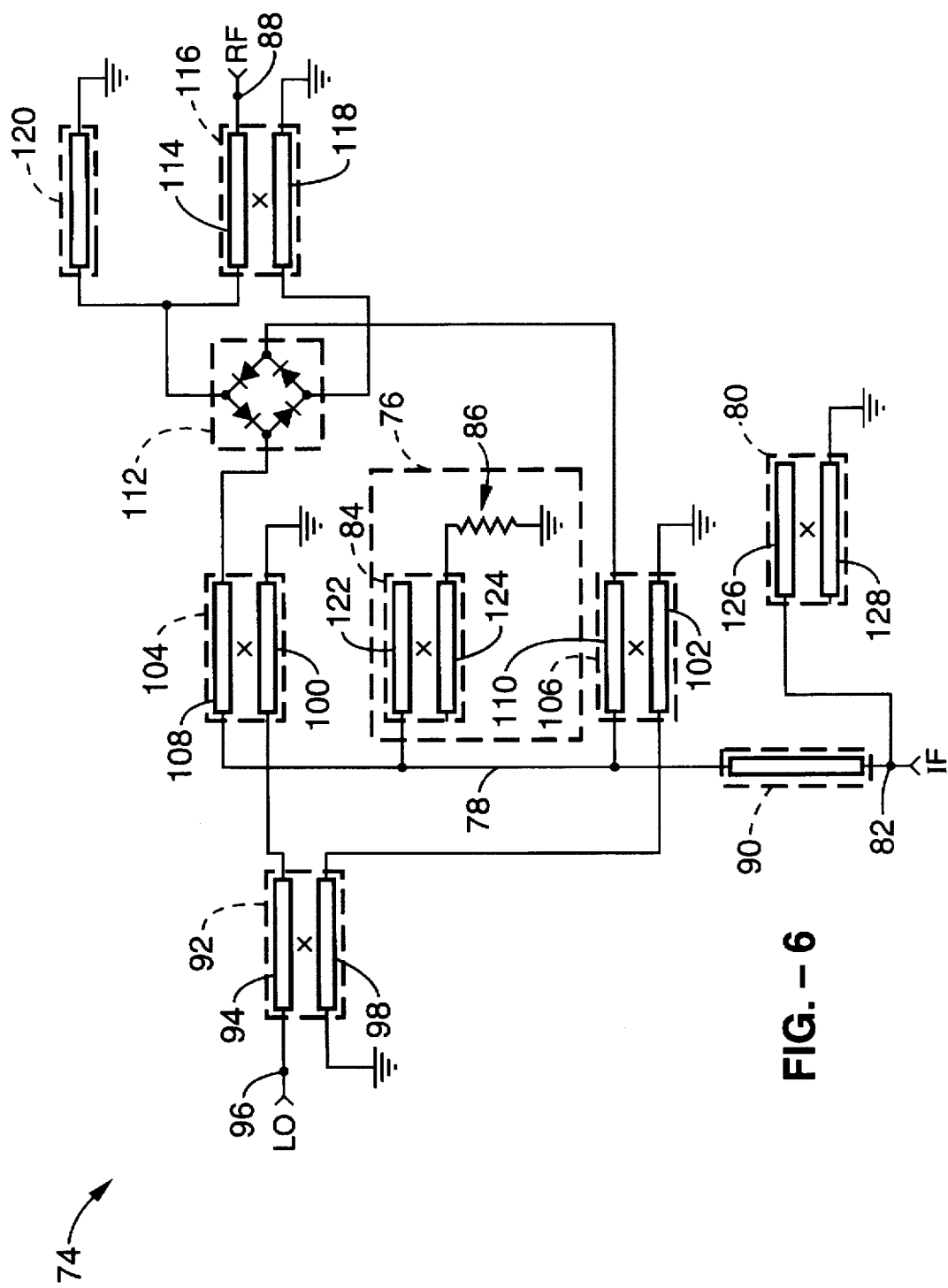
FIG. 6 is a schematic diagram of a mixer employing transmission line cell elements shown in FIG. 1.

Referring now to FIG. 6, a plurality of cells 10 in accordance with the present invention can be used to construct a mixer 74 as shown. Mixer 74 has the same topology as the mixer described in U.S. Pat. No. 5,534,830, with the addition of a diplexer element 76 at the I-port connection 78, and the optional inclusion of a cell 80 configured as a shunt capacitor at the IF port 82.

Diplexer 76 comprises a capacitor 84 in series with a termination resistor 86 connected to ground. Termination resistor 86 can be a conventional thick film resistor connected to ground using a metallized via to the backside ground metal. Diplexer 76 serves the purpose of reducing the amount of local oscillator leakage (LO) at both the I-port connection 78 and the RF port 88 by terminating higher order products exiting IF port 82 rather than reflecting those products back into the mixer. Capacitor 80 works in combination with transmission line 90, which can be the bottom trace of a cell, to form a low pass filter network that reduces leakage from the IF port 82.

As indicated above, mixer 74 uses the topology described in U.S. Pat. No. 5,534,830. Cell 92 includes a top trace 94, one end of which is connected to LO port 96. The corresponding end of bottom trace 98 is connected to ground. The opposite output ends of top and bottom traces 94, 98 are connected to input ends of bottom traces 100, 102 of cells 104, 106, respectively. The opposite ends of bottom traces 100, 102 are connected to ground. Top traces 108, 110 of cells 104, 106 are tied together at their input ends and coupled to IF port 82 through transmission line 90. The opposite output ends of top traces 108, 110 are connected to diode quad 112. Cells 104, 106 comprise a pair of inverting transmission line structures, coupling the balanced output from cell 92 to diode quad 108.

The output end of top trace 114 of cell 116 connected to RF port 88. The corresponding end of bottom conductor 118 of that cell is connected to ground. The opposite input ends of top and bottom traces 114, 118 are connected to diode bridge 112 as shown. A single transmission line 120, which can be a bottom trace of a cell, is shunted to ground across the connection between top trace 114 and diode bridge 112. The two ground returns provided by transmission line 120 and bottom trace 118 of cell 116 provide for improved ground return balance for cell 116, as well as the required direct current return path connection for the IF frequency during the conversion process. A balun is thus formed that keeps the phase velocity equal.

Capacitor 84 comprises a cell wherein the input end of top trace 122 is connected to the input ends of top traces 108, 110, and the opposite end is left unconnected. The corresponding input end of bottom trace 124 is also left unconnected while the output end is shunted to ground through termination resistor 86. Capacitor 80 comprises a cell wherein the input end of top trace 126 is connected to IF port 82 and the opposite end is left unconnected. The corresponding input end of bottom trace 128 is also left unconnected while the output end is shunted to ground.

Figure 3:
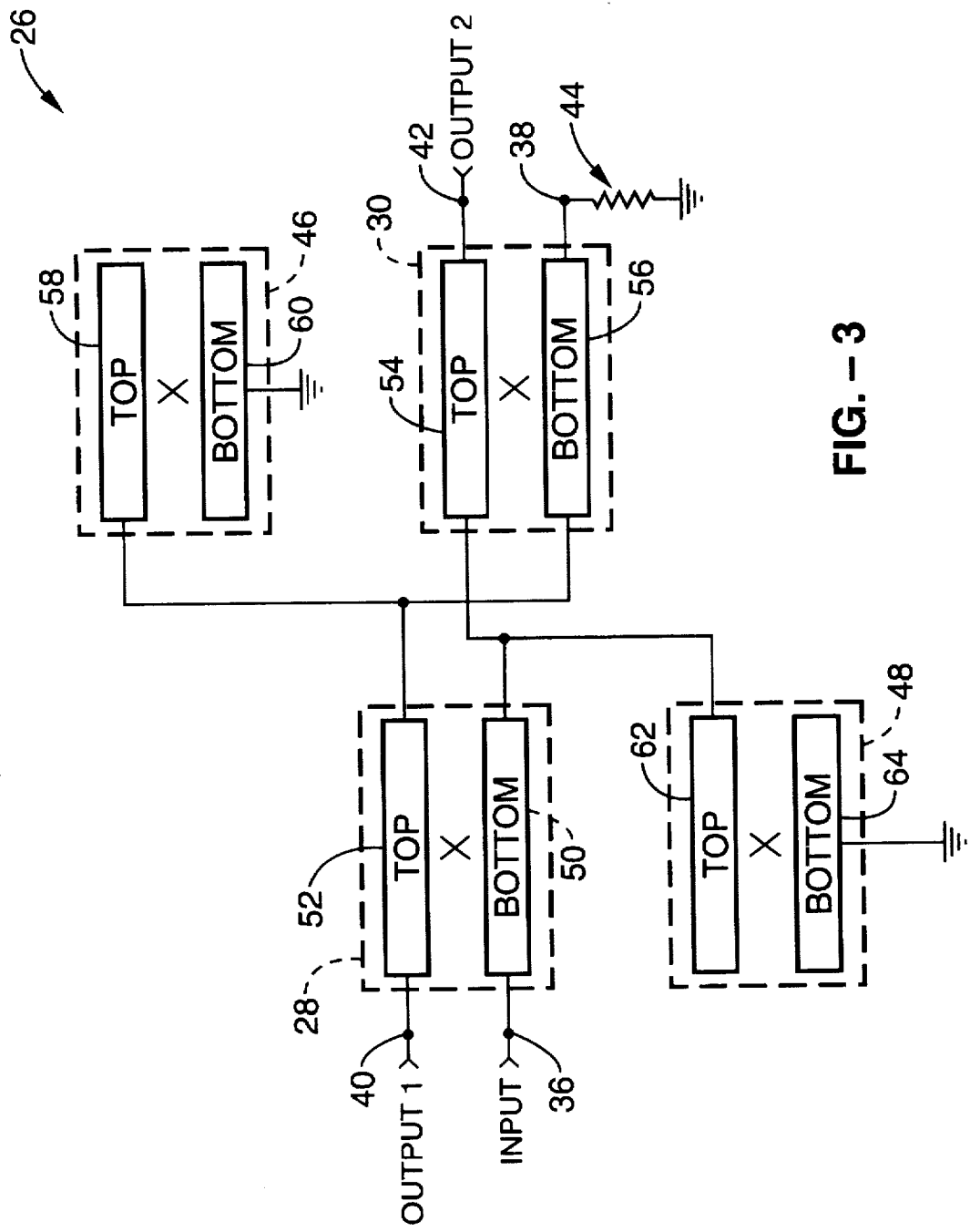
FIG. 3 is a schematic diagram of a quadrature coupler employing transmission line cell elements shown in FIG. 1.
Figure 7:
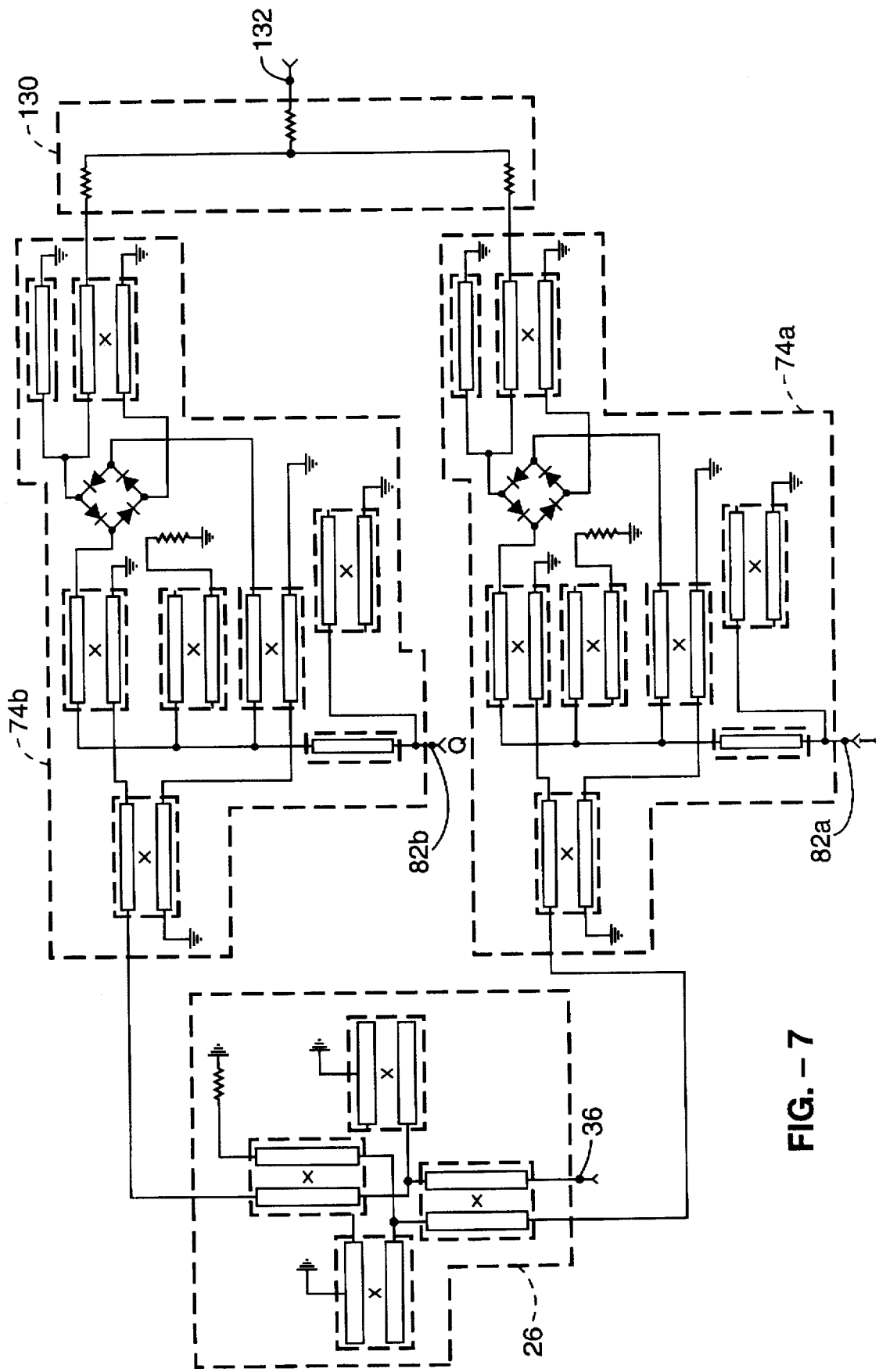
FIG. 7 is a schematic diagram of a modulator/demodulator employing the quadrature coupler shown in FIG. 3 and the mixer shown in FIG. 6 with a resistive power divider/combiner.
Figure 8:
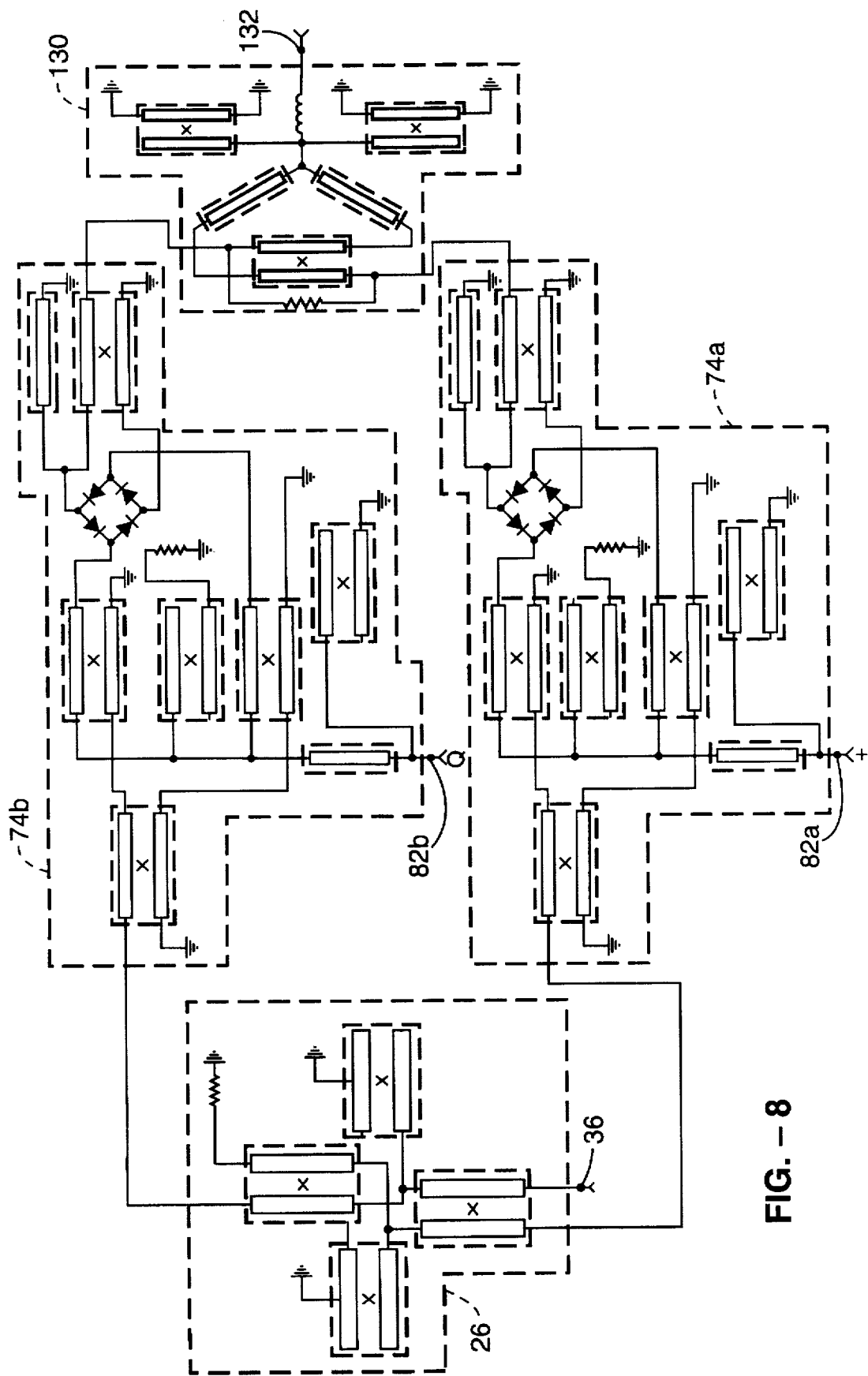
FIG. 8 is a schematic diagram of an alternative embodiment of the modulator/demodulator shown in FIG. 7 employing a balanced line power splitter/combiner.

Referring now to FIG. 7, a modulator/demodulator can be fabricated by combining a quadrature coupler as shown FIG. 3 with two of the mixers shown in FIG. 6 and using a resistive power splitter/combiner on the outputs of the mixers. Another example of a modulator/demodulator having a similar configuration is shown in FIG. 8, except that a two way, zero degree, power splitter/combiner as described in U.S. Pat. No. 5,534,830 is used instead of a resistive power splitter/combiner. In both configurations, a high level signal supplied to quadrature coupler 26 at input port 36 is split and applied to two mixers 74a, 74b. The in-phase port (I-port) 82a and quadrature phase port (Q-port) 82b of each mixer are driven by low level signals equal in amplitude, and 90 degrees out of phase. The resulting signals are presented to the dual inputs of power splitter/combiner 130, with desired signals combining, and undesired signals ideally canceling, with the resulting composite signal exiting at RF port 132. The same configuration can be used as a demodulator by reversing the inputs and outputs.

Figure 9:
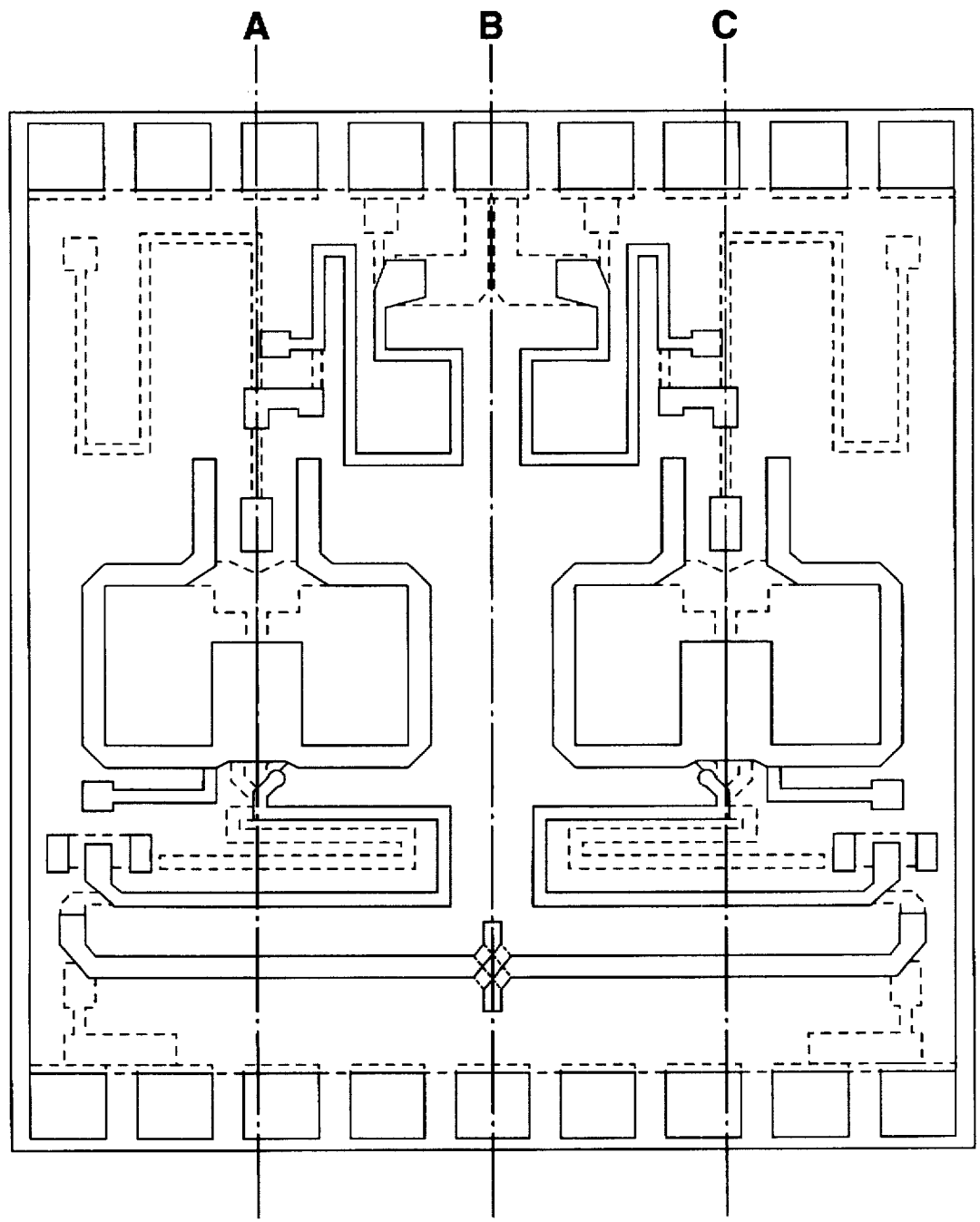
FIG. 9 is a top plan view of a modulator/demodulator according to FIG. 7 showing lines of symmetry between circuit elements.

As can be seen in FIG. 9, which represents a top plan view of the modulator/demodulator shown schematically in FIG. 7, the elements are arranged in symmetrical fashions about the indicated center lines A, B and C shown. This symmetry, which is not achievable except with the cells in accordance with the present invention, provides a number of advantages. For example, the center feed point provides for equidistant ground returns for both mixers, as well as the I and Q mixer ports. The symmetrical feeds from the RF side of the mixers to the diodes improves isolation from the LO side to the RF side of the mixers. Furthermore, the symmetrical diode locations ease assembly across modulator cells in a thick film array.

Accordingly, it will be seen that this invention provides a balanced transmission line cell and quadrature coupler construct which can be used in the construction of microwave IQ modulators, IQ demodulators, vector modulators, image reject mixers, and multi-channel mixers. The thin lines used in the present invention, which are approximately 80% less width than in conventional printed balanced line structures, allow for maximum component densities by meandering the lines on the substrate, resulting in reduction of the overall size of the microwave device being fabricated.

Although the description above contains many specificities, these should not be construed as limiting the scope of the invention but as merely providing illustrations of some of the presently preferred embodiments of this invention. Thus the scope of this invention should be determined by the appended claims and their legal equivalents.

I claim:

1. A thick film balanced transmission line cell, comprising:
    (a) a dielectric substrate base, said substrate base having first and second sides;
    (b) a metal backplane adjacent to said first side of said substrate base;
    (c) a first continuous metal trace, said first metal trace print and fire deposited on said second side of said substrate base, said first metal trace having a width W and a length L;
    (d) a dielectric layer, said dielectric layer print and fire deposited over and around said first metal trace, said dielectric layer having a thickness ranging from approximately 0.001 inches to approximately 0.002 inches, said dielectric layer having a dielectric constant ranging from approximately 2 to approximately 6; and
    (e) a second continuous and exposed metal trace, said second metal trace print and fire deposited on said dielectric layer, said second metal trace having a width W' and said length L;
    (f) said second metal trace aligned with and generally parallel to said first metal trace over said width W and said length L of said first metal trace, said first end of said second metal trace being aligned with said first end of said first metal trace, said second end of said second metal trace being aligned with said second end of said first metal trace.

2. A thick film balanced transmission line cell as recited in claim 1, wherein said first and second metal traces form a balanced transmission line having an operational frequency determined by said length L, an odd mode line impedance determined by said widths of said first and second metal traces, and an even mode line impedance set by said metal backplane.

3. A thick film balanced transmission line cell as recited in claim 1, wherein said dielectric layer has a nominal thickness of 0.0016 inches and a dielectric constant of approximately 4.5.

4. A thick film balanced transmission line cell as recited in claim 1, wherein said width of said first metal trace is approximately 0.006 inches to 0.020 inches and said width of said second metal trace is approximately 0.005 inches to 0.008 inches.

5. A thick film balanced transmission line cell as recited in claim 1, wherein said dielectric substrate base comprises a high alumina content ceramic material.

6. A thick film balanced transmission line cell, comprising:
    (a) a dielectric substrate base, said substrate base having first and second sides;
    (b) a metal backplane adjacent to said first side of said substrate base;

(c) a first continuous metal trace, said first metal trace print and fire deposited on said second side of said substrate base, said first metal trace having a width W and a length L;

(d) a dielectric layer, said dielectric layer print and fire deposited over and around said first metal trace, said dielectric layer having a thickness ranging from approximately 0.001 inches to approximately 0.002 inches, said dielectric layer having a dielectric constant ranging from approximately 2 to approximately 6; and (e) a second continuous and exposed metal trace, said second metal trace print and fire deposited on said dielectric layer, said second metal trace having a width W' and said length L;

(f) said second metal trace aligned with and generally parallel to said first metal trace over said width W and said length L of said first metal trace, said first end of said second metal trace being aligned with said first end of said first metal trace, said second end of said second metal trace being aligned with said second end of said first metal trace;

(g) wherein said first and second metal traces form a balanced transmission line having an operational frequency determined by said length L, an odd mode line impedance determined by said widths of said first and second metal traces, and an even mode line impedance set by said metal backplane.

7. A thick film balanced transmission line cell as recited in claim 6, wherein said dielectric layer has a nominal thickness of 0.0016 inches and a dielectric constant of approximately 4.5.

8. A thick film balanced transmission line cell as recited in claim 6, wherein said width of said first metal trace is approximately 0.006 inches to 0.020 inches and said width of said second metal trace is approximately 0.005 inches to 0.008 inches.

9. A thick film balanced transmission line cell as recited in claim 6, wherein said dielectric substrate base comprises a high alumina content ceramic material.

10. A thick film quadrature coupler, comprising:

(a) a plurality of balanced transmission line cells, each said cell including
   (i) a dielectric substrate base, said substrate base having first and second sides,
   (ii) a metal backplane adjacent to said first side of said substrate base,
   (iii) a first metal trace deposited on said second side of said substrate base, said first metal trace having first and second ends,
   (iv) a dielectric layer deposited over and around said first metal trace,
   (v) a second metal trace deposited on said dielectric layer, said second metal trace having first and second ends,
   (vi) said second metal trace aligned with and generally parallel to said first metal trace, said first ends of said first and second metal traces having a common orientation, and said second ends of said first and second metal traces having a common orientation;

(b) a first one of said transmission line cells having an input at said first end of said first trace and an in-phase output at said first end said second trace;

(c) a second one of said transmission line cells having a resistive termination at said first end of said of said first trace and a quadrature phase output at said first end of said second trace, said second end of said first trace of said second cell electrically connected to said second end of said second trace of said first cell, said second end of said second trace of said second cell electrically connected to said second end of said first trace of said first cell;

(d) a third one of said transmission line cells having a first end of said second trace electrically connected to said second end of said second trace of said first cell and said second end of said first trace of said second cell, said first trace of said third cell electrically connected to ground; and (e) a fourth one of said transmission line cells having a first end of said second trace electrically connected to said second end of said first trace of said first cell and said second end of said second trace of said second cell, said first trace of said fourth cell electrically connected to ground.

11. A thick film quadrature coupler as recited in claim 10, wherein said first trace of said third cell is electrically connected to said backplane of said third cell at the approximate midpoint between said first and second ends of said first trace of said third cell, and wherein said first trace of said fourth cell is electrically connected to said backplane of said fourth cell at the approximate midpoint between said first and second ends of said first trace of said fourth cell.

12. A thick film quadrature coupler as recited in claim 10, wherein said first, second, third and fourth cells have contiguous backplanes, contiguous substrate bases and contiguous dielectric layers.

13. A thick film quadrature coupler as recited in claim 10, wherein said second ends of said first and second traces of said first cell are positioned opposite said second ends of said first and second traces of said second cell, wherein said first and second cells each have a longitudinal axis extending between said first and second ends of said traces, wherein the longitudinal axes of said first and second cells are aligned so as to form a common longitudinal axis, wherein a lateral axis passes between said second ends of said traces of said first and second cells, wherein said lateral axis is perpendicular to said common longitudinal axis, and wherein said first and second cells are symmetrical about said lateral axis.

14. A thick film quadrature coupler, comprising:

(a) a plurality of balanced transmission line cells, each said cell including
   (i) a dielectric substrate base, said substrate base having first and second sides,
   (ii) a metal backplane adjacent to said first side of said substrate base,
   (iii) a bottom metal trace deposited on said second side of said substrate base, said bottom metal trace having a trace width and a trace length, said first bottom metal trace having first and second ends,
   (iv) a dielectric layer deposited over and around said bottom metal trace,
   (v) a top metal trace deposited on said dielectric layer, said top metal trace having a trace width and a trace length, said top metal trace having first and second ends,
   (vi) said top metal trace aligned with and generally parallel to said bottom metal trace over said trace lengths and widths, said first ends of said top and bottom metal traces having a common orientation, and said second ends of said top and bottom metal traces having a common orientation,
   (vii) wherein said top and bottom metal traces form a balanced transmission line having an operational frequency determined by said trace lengths, an odd mode line impedance determined by said trace widths, and an even mode line impedance set by said metal backplane;

(b) a first one of said transmission line cells having an input at said first end of said bottom trace and an in-phase output at said first end said top trace;

(c) a second one of said transmission line cells having a resistive termination at said first end of said of said bottom trace and a quadrature phase output at said first end of said top trace, said second end of said bottom trace of said second cell electrically connected to said second end of said top trace of said first cell, said second end of said top trace of said second cell electrically connected to said second end of said bottom trace of said first cell;

(d) a third one of said transmission line cells having a first end of said top trace electrically connected to said second end of said top trace of said first cell and said second end of said bottom trace of said second cell, said bottom trace of said third cell electrically connected to ground; and (e) a fourth one of said transmission line cells having a first end of said top trace electrically connected to said second end of said bottom trace of said first cell and said second end of said top trace of said second cell, said bottom trace of said fourth cell electrically connected to ground.

15. A thick film quadrature coupler as recited in claim 14, wherein said first trace of said third cell is electrically connected to said backplane of said third cell at the approximate midpoint between said first and second ends of said first trace of said third cell, and wherein said first trace of said fourth cell is electrically connected to said backplane of said fourth cell at the approximate midpoint between said first and second ends of said first trace of said fourth cell.

16. A thick film quadrature coupler as recited in claim 14, wherein said first, second, third and fourth cells have contiguous backplanes, contiguous substrate bases and contiguous dielectric layers.

17. A thick film quadrature coupler as recited in claim 14, wherein said second ends of said first and second traces of said first cell are positioned opposite said second ends of said first and second traces of said second cell, wherein said first and second cells each have a longitudinal axis extending between said first and second ends of said traces, wherein the longitudinal axes of said first and second cells are aligned so as to form a common longitudinal axis, wherein a lateral axis passes between said second ends of said traces of said first and second cells, wherein said lateral axis is perpendicular to said common longitudinal axis, and wherein said first and second cells are symmetrical about said lateral axis.

18. A thick film microwave mixer, comprising:

(a) a plurality of balanced transmission line cells, each said cell including (i) a dielectric substrate base, said substrate base having first and second sides, (ii) a metal backplane adjacent to said first side of said substrate base, (iii) a bottom metal trace deposited on said second side of said substrate base, said bottom metal trace having a trace width and a trace length, said first bottom metal trace having first and second ends, (iv) a dielectric layer deposited over and around said bottom metal trace, (v) a top metal trace deposited on said dielectric layer, said top metal trace having a trace width and a trace length, said top metal trace having first and second ends, (vi) said top metal trace aligned with and generally parallel to said bottom metal trace over said trace lengths and widths, said first ends of said top and bottom metal traces having a common orientation, and said second ends of said top and bottom metal traces having a common orientation, (vii) wherein said top and bottom metal traces form a balanced transmission line having an operational frequency determined by said trace lengths, an odd mode line impedance determined by said trace widths, and an even mode line impedance set by said metal backplane;

(b) a first one of said transmission line cells having a local oscillator port, first and second outputs, and a ground connection;

(c) a second one of said transmission line cells having first and second inputs, an output, and a ground connection;

(d) a third one of said transmission line cells having first and second inputs, an output, and a ground connection;

(e) a fourth one of said transmission line cells having first and second inputs, a radio frequency port, and a ground connection;

(f) said first output of said first cell electrically connected to said first input of said second cell, said second output of said first cell electrically connected to said first input of said third cell, said second input of said second cell electrically connected to said second input of said third cell, said second inputs of said second and third cells electrically connected to an intermediate frequency port, said output of said second cell electrically connected to a first input of a diode quad, said output of said third cell electrically connected to a second input of said diode quad, said first input of said fourth cell electrically connected to a first output of said diode quad, said second input of said fourth cell electrically connected to a second output of said diode quad.

19. A thick film microwave mixer as recited in claim 18, further comprising a fifth one of said transmission line cells having first and second inputs and first and second outputs, said first input of said fifth cell electrically connected to said second input of said second cell and said second input of said third cell, said second output of said fifth cell electrically connected to ground through a resistor.

20. A thick film microwave mixer as recited in claim 18, further comprising:

(a) a transmission line in series with said IF port and said connection between said second input of said second cell and said second input of said third cell; and (b) a sixth one of said transmission line cells having first and second inputs and first and second outputs, said first input of said sixth cell electrically connected to said IF port, said second output of said sixth cell electrically connected to ground, said transmission line and said sixth cells forming a low pass filter.

21. A thick film microwave modulator/demodulator, comprising:

(a) a quadrature coupler, said quadrature coupler having an input port, and in-phase output port and a quadrature phase output port;

(b) a first mixer, said first mixer having a local oscillator port, an intermediate frequency port and a radio frequency output;

(c) a second mixer, said second mixer having a local oscillator port, an intermediate frequency port and a radio frequency port; and (d) a power combiner/splitter having a first input port, a second input port and an output port;

(e) said in-phase output port of said quadrature coupler electrically connected to said local oscillator port of said first mixer, said quadrature phase output port of said quadrature coupler electrically connected to said local oscillator port of said second mixer, said radio frequency port of said first mixer electrically connected to said first input port of said power combiner/splitter, said radio frequency port of said second mixer electrically connected to said second input port of said power combiner/splitter;

(f) said quadrature coupler comprising, (i) a plurality of balanced transmission line cells, each said cell including a dielectric substrate base, said substrate base having first and second sides, a metal backplane adjacent to said first side of said substrate base, a first metal trace deposited on said second side of said substrate base, said first metal trace having first and second ends, a dielectric layer deposited over and around said first metal trace, a second metal trace deposited on said dielectric layer, said second metal trace having first and second ends, said second metal trace aligned with and generally parallel to said first metal trace, said first ends of said first and second metal traces having a common orientation, and said second ends of said first and second metal traces having a common orientation, (ii) a first one of said transmission line cells having an input at said first end of said first trace and an in-phase output at said first end said second trace, (iii) a second one of said transmission line cells having a resistive termination at said first end of said of said first trace and a quadrature phase output at said first end of said second trace, said second end of said first trace of said second cell electrically connected to said second end of said second trace of said first cell, said second end of said second trace of said second cell electrically connected to said second end of said first trace of said first cell, (iv) a third one of said transmission line cells having a first end of said second trace electrically connected to said second end of said second trace of said first cell and said second end of said first trace of said second cell, said first trace of said third cell electrically connected to ground, and (v) a fourth one of said transmission line cells having a first end of said second trace electrically connected to said second end of said first trace of said first cell and said second end of said second trace of said second cell, said first trace of said fourth cell electrically connected to ground.

* * * * *